United States Patent [19]

Toshimitsu et al.

[11] Patent Number: 5,399,398
[45] Date of Patent: Mar. 21, 1995

[54] PHOTOMASK CONTAINER

[75] Inventors: Watanabe Toshimitsu; Y. Matsuzawa, both of Tokyo, Japan

[73] Assignee: Toppan Printing Co., Ltd., Tokyo, Japan

[21] Appl. No.: 111,056

[22] Filed: Aug. 24, 1993

[30] Foreign Application Priority Data

Sep. 7, 1992 [JP] Japan .................... 4-264243

[51] Int. Cl.⁶ .......................................... B65D 85/48
[52] U.S. Cl. ..................... 428/35.7; 428/76; 428/543; 428/922; 206/334; 206/454; 206/328; 206/524.6; 211/41; 248/316.2; 248/316.5
[58] Field of Search ............. 428/35.7, 76, 543, 922; 206/334, 454, 328, 329, 455, 524.6; 211/41; 248/316.2, 316.5

[56] References Cited

U.S. PATENT DOCUMENTS

| | | | |
|---|---|---|---|
| 4,336,316 | 6/1982 | Sato | 430/5 |
| 4,629,677 | 12/1986 | Katoh | 430/215 |
| 4,659,646 | 4/1987 | Inoue | 430/230 |
| 4,814,180 | 3/1989 | Eckenhoff et al. | 424/473 |
| 4,912,015 | 3/1990 | Idota | 430/248 |
| 5,025,924 | 6/1991 | Watanabe | 206/328 |

Primary Examiner—Charles R. Nold
Attorney, Agent, or Firm—Armstrong, Westerman, Hattori, McLeland & Naughton

[57] ABSTRACT

The improved photomask container which is molded and fabricated from a thermoplastic resin is characterized in that the thermoplastic resin comprises a cellulose ester and that the surface of the molded and fabricated article is saponified with an alkali. The container does not give off malodor, has electric conductivity and is free from the problem of sodium release.

6 Claims, 1 Drawing Sheet

PHOTOMASK CONTAINER

BACKGROUND OF THE INVENTION

This invention relates to a photomask container, more particularly to a container in which photomasks can be transported and stored without damage to their quality.

Photomasks require a very precision in definition and must be stored with utmost care. They are usually stored or transported in containers that are airtight and which feature various geometric designs that prevent photomasks from contacting each other.

Because of ease in molding and fabricating operations, styrenic or acrylic resins have conventionally been used to manufacture photomask containers. Styrenic resins are used with particular preference since they are highly transparent and can easily be formed by injection molding. On the other hand, the containers made of styrenic or acrylic resins have no electric conductivity and, during the storage or transport of photomasks, static charges will build up to increase the chance of a discharge of occurring between the container and photomasks, thereby potentially destroying the photomask pattern. As a further problem, the static charges on the container will attract suspended dust particles in air and, if the container is brought into the Si wafer preparation line, process contamination will occur.

In order to solve these problems, it has been proposed that acrylic resins such as polymethyl methacrylate be rendered conductive by dispersing a conductive acrylic rubber to produce a three-dimensional network in the resin. However, this is not a complete solution to the problems at issue. If acrylic resins are used, monomers such as methyl acrylate and methyl methacrylate will remain in the wall of the molded container and such residual monomers will be liberated from the container during storage or transport of photomasks, with the emitted odor being a potential hazard to the health of the operating personnel. Furthermore, since sodium metasilicate is used to have the conductive acrylic rubber enter into a crosslinking reaction, sodium may be released from the wall of the molded container to adhere to photomasks that are being stored or transported in the container. As a consequence, the transparency of the substrate glass will decrease to cause adverse effects not only on the efficiency of resist development in the Si wafer preparation line but also on the contact exposure of silicon wafers since the releassed sodium may be transferred to the wafers to degrade the quality of a completed IC chip product.

SUMMARY OF THE INVENTION

An object, therefore, of the present invention is to provide a photomask container that will not give off malodor, that has electric conductivity and which is free from the problem of sodium release.

This object can be attained by a photomask container that is molded and fabricated from a thermoplastic resin comprising a cellulose ester and which is saponified with an alkali after molding and fabrication.

DETAILED DESCRIPTION OF THE INVENTION

Figure 1:
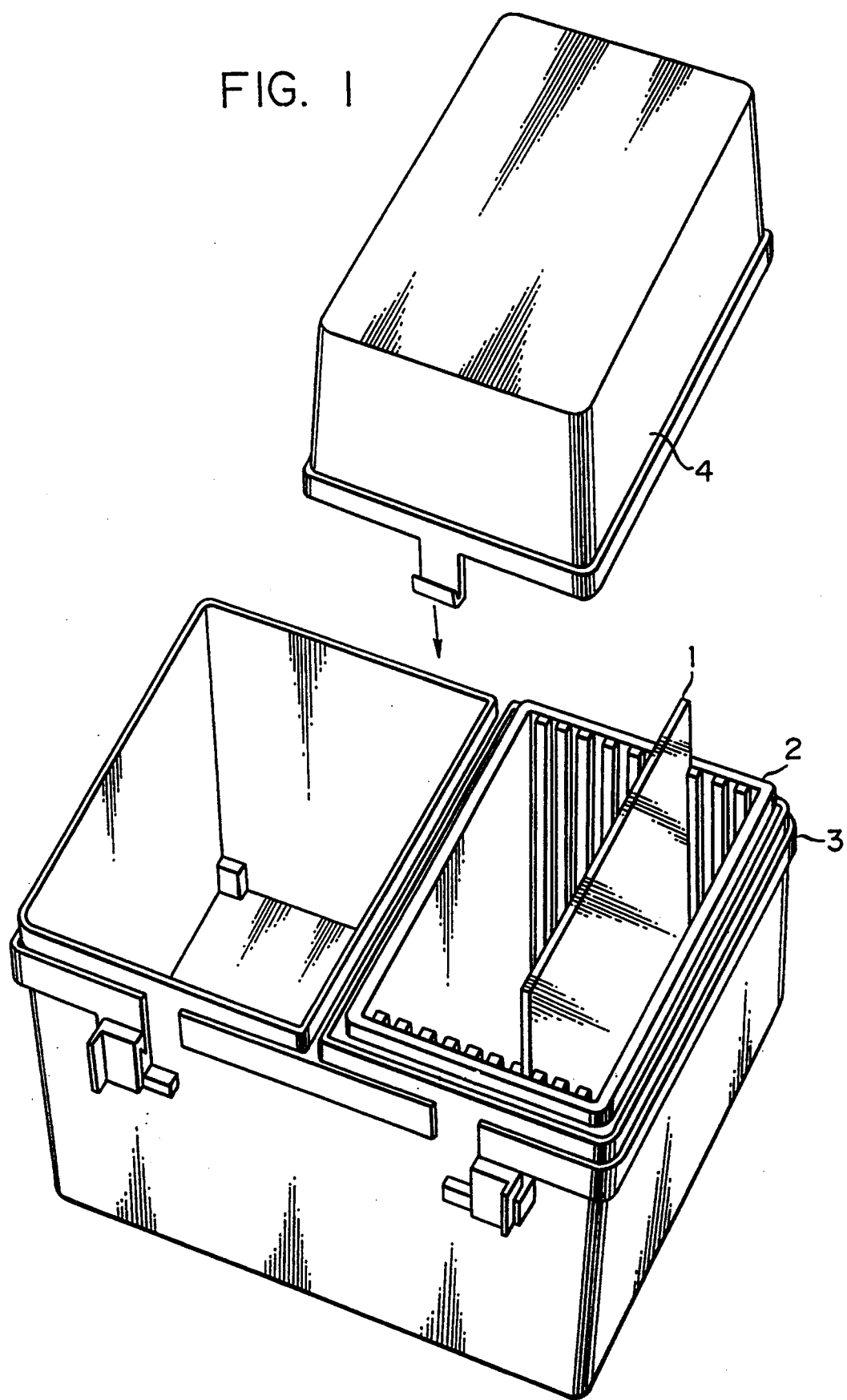
FIG. 1 is a perspective view showing schematically an example of the photomask container of the present invention.

The cellulose ester used as the thermoplastic resin which forms the photomask container of the present invention is a cellulosic compound that is partly or totally esterified and may be exemplified by cellulose acetate, cellulose propionate and cellulose butyrate. These cellulose ester resins may contain plasticizers, stabilizers, fillers and other additives as required.

After molding and fabricating these cellulose ester resins, the surface of the article is saponified with an alkali to impart conductivity. To this end, the article may be immersed in a 5-15 wt % aqueous solution of an alkali such as potassium hydroxide or sodium hydroxide for 5-100 min at a temperature of 40°-80° C.

As long as the photomask container of the present invention is formed of the materials described above, it may take on any shape that is not detrimental to the purposes of the present invention. A typical example is shown in FIG. 1 and it is an airtightly closable container comprising an inner case 2 that permits a plurality of photomasks 1 to be contained without contacting each other, an outer case 3 that accommodates the inner case 2, and a top cover 4 that is optionally fitted with a photomask securing member. To insure that photomasks are positively held in position, the inner case makes direct contact with photomasks. And it is at least necessary that the inner case is formed of a material that comprises the cellulose ester defined hereinabove and which has been saponified with an alkali. Preferably, the outer case and the top cover are formed of the same material.

The container of the present invention is formed of a thermoplastic resin comprising a cellulose ester and this is effective in preventing the emission of malodor and the release of sodium, the two major problems that have occurred to the conventional photomask containers. The surface of the container, after being molded and fabricated, is saponified with an alkali and this imparts conductivity to the container.

The following example is provided for the purpose of further illustrating the present invention but is in no way to be taken as limiting.

EXAMPLE

A cellulose propionate resin (TENITE PROPIONATE 307, the trade name of Eastman Chemical Inc.) was injection molded to the shape shown in FIG. 1. The molded part was immersed in an aqueous solution of KOH to have its surface saponified, thereby producing sample container No. 1.

The procedure of producing sample No. 1 was repeated except that no saponification was conducted. The sample thus produced was designated No. 2.

The procedure of producing sample No. 1 was repeated except that the cellulose propionate resin was replaced by a polystyrene resin. The sample thus produced was designated No. 3.

The procedure of producing sample No. 1 was repeated except that the cellulose propionate resin was replaced by a resin having a conductive acrylic rubber dispersed in PMMA to provide a three-dimensional network. The sample thus produced was designated No. 4.

Sample Nos. 1-4 thus produced were subjected to the following evaluations. Organoleptic test for odor:

A board of panelist was asked if they smelled malodor in each container, Charging test:

Charging voltage (Vmax) and half-life ($\tau_{\frac{1}{2}}$) were measured for each sample under the following conditions. Decay voltage ($D_v$) was also measured one minute after the supply of voltage was cut off. Tester: Staic Honest Meter (product of Shishido Shokai K.K.) Applied voltage: 8 KV Time: 60 sec Distance between applying electrode and sample: 20 mm Distance between detecting electrode and sample: 10 mm Impurity concentration measurement:

The concentrations of impurities as detected from each sample were measured with an atomic absorption spectroscopic apparatus.

The results are shown in Table 1 below.

TABLE 1

| Sample No. | Odor | V max (V) | $\tau_{\frac{1}{2}}$ (s) | $D_v$ (V) | Impurity (ppb) | | |
|---|---|---|---|---|---|---|---|
| | | | | | Na | K | Mg |
| 1 (Invention) | Not detected | 50 | <1 | — | 3.3 | <0.1 | <0.1 |
| 2 (Comparison) | Not detected | 1290 | 1 | — | — | — | — |
| 3 (Comparison) | Not detected | 1620 | — | 10 | 4.4 | 5.7 | <0.1 |
| 4 (Comparison) | Smelled methyl acrylate monomer | 50 | <1 | — | 1072.0 | 1.0 | 0.9 |

The above data show that container sample No. 1 of the present invention excelled the three comparative samples in all aspects tested, odor, the release of impurities (in particular, Na), and conductivity.

The photomask container of the present invention offers the following advantages. First, it does not give off malodor and hence can be handled safely by the operating personnel during the transport and storage of photomasks. Secondly, the container releases sodium in such a small amount that it will not cause the various problems that have occurred in conventional containers, such as the adhesion of sodium to the substrate glass to lower its transparency, which eventually affects the efficiency of resist development in the process of silicon wafer preparation, and the transfer of sodium to Si wafers to eventually degrade the quality of completed IC chip products. Thirdly, the container has sufficient conductivity to prevent not only static buildup that may eventually destroy the chromium pattern on photomasks but also the attraction of suspended dust particles in air during the transport or storage of photomasks.

What is claimed is:

1. A photomask container molded and fabricated from a thermoplastic resin, the container being an airtightly closable container comprising an inner case for holding a plurality of photomasks, an outer case accommodating the inner case, and a top cover, said thermoplastic resin comprising a cellulose ester and a surface of the molded and fabricated article being saponified with an alkali.

2. A photomask container according to claim 1 which is an airtightly closable container comprising an inner case that permits a plurality of photomasks to be contained without contacting each other, an outer case that accommodates said inner case, and a top cover that is optionally fitted with a photomask securing member, at least said inner case being formed of the cellulose ester and alkali saponified on the surface after molding and fabrication.

3. A photomask container according to claim 2 wherein said inner case, said outer case, and said top cover are all formed of the cellulose ester and alkali saponified on the surface after molding and fabrication.

4. A photomask container according to claim 1, 2 or 3 wherein said cellulose ester is selected from the group consisting of cellulose acetate, cellulose propionate and cellulose butyrate.

5. A photomask container according to claim 1, 2 or 3 wherein the saponification is carried out by immersing the molded and fabricated container in an aqueous alkali solution.

6. A photomask container according to claim 5 wherein the saponification is carried out by immersing the molded and fabricated container in a 5–15 wt % aqueous solution of an alkali for 5–100 min at a temperature of 40°–80° C.

* * * * *